US008214195B2

(12) United States Patent
Durand et al.

(10) Patent No.: US 8,214,195 B2
(45) Date of Patent: Jul. 3, 2012

(54) TESTING IN A HARDWARE EMULATION ENVIRONMENT

(75) Inventors: Eric Durand, La Ville du Bois (FR); Estelle Reymond, Orsay (FR); Laurent Buchard, Le Bois du Roi (FR)

(73) Assignee: Mentor Graphics Corporation, Wilsonville, OR (US)

( * ) Notice: Subject to any disclaimer, the term of this patent is extended or adjusted under 35 U.S.C. 154(b) by 970 days.

(21) Appl. No.: 12/053,483

(22) Filed: Mar. 21, 2008

(65) Prior Publication Data

US 2009/0240457 A1   Sep. 24, 2009

(51) Int. Cl.
    *G06F 9/455*   (2006.01)
(52) U.S. Cl. .................. 703/24; 714/28; 714/30; 714/31
(58) Field of Classification Search ........... 703/23, 703/24, 26, 28; 702/119, 120; 714/25, 27–31
    See application file for complete search history.

(56) References Cited

U.S. PATENT DOCUMENTS

| 5,838,948 | A | * | 11/1998 | Bunza ............................. 703/27 |
| 5,838,949 | A | | 11/1998 | Hassoun |
| 5,903,744 | A | | 5/1999 | Tseng et al. |
| 5,963,735 | A | | 10/1999 | Sample et al. |
| 6,009,256 | A | | 12/1999 | Tseng et al. |
| 6,026,230 | A | | 2/2000 | Lin et al. |
| 6,134,516 | A | | 10/2000 | Wang et al. |
| 6,230,119 | B1 | | 5/2001 | Mitchell |
| 6,266,721 | B1 | | 7/2001 | Sheikh et al. |
| 6,332,201 | B1 | * | 12/2001 | Chin et al. ....................... 714/28 |
| 6,445,969 | B1 | | 9/2002 | Kenney et al. |
| 6,539,535 | B2 | | 3/2003 | Butts et al. |
| 6,665,706 | B2 | | 12/2003 | Kenner et al. |
| 6,698,012 | B1 | | 2/2004 | Kossatchev et al. |
| 6,721,922 | B1 | | 4/2004 | Walters et al. |

(Continued)

FOREIGN PATENT DOCUMENTS

EP    0 935 195    8/1999

(Continued)

OTHER PUBLICATIONS

Zuver et al., Internet-Based Tool for System-On-Chip Project Testing and Grading, IEEE International Conference on Microelectronic Systems Education, 2003, pp. 119-120.*

(Continued)

*Primary Examiner* — Russell Frejd
(74) *Attorney, Agent, or Firm* — Klarquist Sparkman, LLP (57) ABSTRACT

A system and method is disclosed for testing emulation boards in a hardware emulation environment. In one embodiment, test files can be maintained that identify a list of test commands. Such a list can be easily changed without recompiling. In another embodiment, the list of commands can be read by a first server. The commands can be passed (e.g., sequentially) to a second server associated with one or more emulator boards. The second server can ensure that the commands are executed on the specified emulator boards for testing the emulator boards. In yet another embodiment, a user can request a series of tests to be executed. The tests can be included in a list of test names. Each test name can correspond to a list of test commands associated with the test name. Thus, a first server can read a test name, read a file of test commands associated with the test name and pass the test commands to a second server to ensure the test commands are executed.

20 Claims, 7 Drawing Sheets

U.S. PATENT DOCUMENTS

| | | |
|---|---|---|
| 6,732,068 B2 | 5/2004 | Bauer et al. |
| 6,839,013 B1 | 1/2005 | Cummins et al. |
| 7,089,170 B2 * | 8/2006 | Buckmaster et al. ........... 703/14 |
| 7,171,347 B2 * | 1/2007 | Khaira et al. ................... 703/15 |
| 7,337,104 B2 * | 2/2008 | Engel et al. ..................... 703/24 |
| 7,480,609 B1 | 1/2009 | Cavanagh et al. |
| 7,546,571 B2 | 6/2009 | Mankin et al. |
| 7,567,894 B2 | 7/2009 | Durand et al. |
| 2001/0020251 A1 | 9/2001 | Sheikh et al. |
| 2002/0108094 A1 | 8/2002 | Scurry |
| 2002/0170030 A1 | 11/2002 | Halcomb et al. |
| 2003/0069724 A1 | 4/2003 | Schubert et al. |
| 2003/0074177 A1 | 4/2003 | Bowen |
| 2003/0074178 A1 | 4/2003 | Sample et al. |
| 2004/0025165 A1 | 2/2004 | Desoli et al. |
| 2005/0268195 A1 | 12/2005 | Lund et al. |
| 2008/0016396 A1 | 1/2008 | Higashi et al. |
| 2009/0106604 A1 | 4/2009 | Lange et al. |
| 2009/0177459 A1 | 7/2009 | Durand et al. |
| 2009/0182544 A1 | 7/2009 | Durand et al. |
| 2009/0216514 A1 | 8/2009 | Durand et al. |
| 2009/0248390 A1 | 10/2009 | Durand et al. |
| 2009/0299723 A1 | 12/2009 | Durand et al. |

FOREIGN PATENT DOCUMENTS

| | | |
|---|---|---|
| WO | WO 01/95238 | 12/2001 |

OTHER PUBLICATIONS

Liu et al., A New Method of TOE Architecture Based on the ML403 Development Board in Linux, First International Multi-Symposiums on Computer and Computational Sciences, 2006, pp. 160-166.*

Izurni et al., Proposal of the Web-Based Training System for the Experiment of the Digital Circuit, The 27th Annual Conference of the IEEE Industrial Electronics Society, 2001, pp. 1766-1770.*

International Search Report and Written Opinion for PCT/EP2006/060335, filed Feb. 28, 2006, pp. 1-12.

Kumar (Prototyping the M68060 for Concurrent Verification, IEEE 1997), pp. 34-41.

Sun et al., Using MATLAB as a Semi-Automated Circuit Emulator with Symbolic Capabilities, pp. 253-258, IEEE 2000.

\* cited by examiner

TESTING IN A HARDWARE EMULATION ENVIRONMENT

FIELD

The present disclosure generally relates to hardware emulators, and more particularly to testing emulator boards in a hardware emulator, such as for diagnostic testing or configuration.

BACKGROUND

Today's sophisticated SoC (System on Chip) designs are rapidly evolving and nearly doubling in size with each generation. Indeed, complex designs have nearly exceeded 50 million gates. This complexity, combined with the use of devices in industrial and mission-critical products, has made complete design verification an essential element in the semiconductor development cycle. Ultimately, this means that every chip designer, system integrator, and application software developer must focus on design verification.

Hardware emulation provides an effective way to increase verification productivity, speed up time-to-market, and deliver greater confidence in the final SoC product. Even though individual intellectual property blocks may be exhaustively verified, previously undetected problems can appear when the blocks are integrated within a system. Comprehensive system-level verification, as provided by hardware emulation, tests many system properties, such as overall system functionality, IP subsystem integrity, specification errors, block-to-block interfaces, boundary cases, and asynchronous clock domain crossings. Although design reuse, intellectual property, and high-performance tools all help by shortening SoC design time, they do not diminish the system verification bottleneck, which can consume 60-70% of the design cycle. As a result, designers can implement a number of system verification strategies in a complementary methodology including software simulation, simulation acceleration, hardware emulation, and rapid prototyping. But, for system-level verification, hardware emulation remains a favorable choice due to superior performance, visibility, flexibility, and accuracy.

A short history of hardware emulation is useful for understanding the emulation environment. Initially, software programs would read a circuit design file and simulate the electrical performance of the circuit very slowly. To speed up the process, special computers were designed to run simulators as fast as possible. IBM's Yorktown "simulator" was the earliest (1982) successful example of this -it used multiple processors running in parallel to run the simulation. Each processor was programmed to mimic a logical operation of the circuit for each cycle and may be reprogrammed in subsequent cycles to mimic a different logical operation. This hardware 'simulator' was faster than the then current software simulators, but far slower than the end-product ICs. When Field Programmable Gate Arrays (FPGAs) became available in the mid-80's, circuit designers conceived of networking hundreds of FPGAs together in order to map their circuit design onto the FPGAs so that the FPGA network would mimic, or emulate, the entire circuit. In the early 90's the term "emulation" was used to distinguish reprogrammable hardware that took the form of the design under test (DUT) versus a general purpose computer (or work station) running a software simulation program.

Soon, variations appeared. Custom FPGAs were designed for hardware emulation that included on-chip memory (for DUT memory as well as for debugging), special routing for outputting internal signals, and for efficient networking between logic elements. Another variation used custom IC chips with networked single bit processors (so-called processor based emulation) that processed in parallel and usually assumed a different logic function every cycle.

Physically, a hardware emulator resembles a large server. Racks of large printed circuit boards are connected by backplanes in ways that most facilitate a particular network configuration. Typically, a workstation connects to the hardware emulator for control, input, and output. Before the emulator can emulate a DUT, the DUT design must be compiled. That is, the DUT's logic must be converted (synthesized) into code that can program the hardware emulator's logic elements (whether they be processors or FPGAs). Also, the DUT's interconnections must be synthesized into a suitable network that can be programmed into the hardware emulator. The compilation is highly emulator specific and can be time consuming.

Testing a hardware emulator is needed for such activities as configuring the emulator, running diagnostics, etc. Problems exist with current testing schemes. For example, to run diagnostics it is necessary to maintain numerous applications on the emulator. Each emulator board can have specific diagnostics needed for that board. If designers want to modify an application, the entire application typically needs to be recompiled and downloaded to the emulator. Many diagnostic applications exist on typical emulators and tracking how each application functions is time-consuming and laborious.

Thus, it is desirable to provide an improved emulator and an emulator with improved techniques for testing.

SUMMARY

The present disclosure provides a system and method in an emulation environment that can allow for testing of emulator boards.

In one embodiment, one or more test files can be maintained that identify a list of test commands. Such a list can be easily modified without recompiling. Thus, tests can be easily added, removed, changed, etc. from one or more such lists without the need to recompile a software application. Additionally, such modifications can be made without special knowledge of software development.

In another embodiment, the list of test commands can be read by a first server. The commands can be passed (e.g., sequentially) to a second server associated with one or more emulator boards. The second server can ensure that the commands are executed on specified emulator boards for testing the emulator boards.

In yet another embodiment, a user can request a series of tests to be executed. The tests can be included in a list of test names. Each test name can correspond to a list of test commands associated with the test name. Thus, a first server can read a test name, read a file of test commands associated with that test name and pass the test commands to a second server to ensure the test commands are executed. The first server can then continue with the list of test names until the list is completed. The results can be reported to a user as intermediate or completed test results.

The foregoing and other objects, features, and advantages of the invention will become more apparent from the following detailed description, which proceeds with reference to the accompanying figures.

DETAILED DESCRIPTION

Disclosed below are representative embodiments of testing techniques and associated apparatus that should not be construed as limiting in any way. Instead, the present disclosure is directed toward all novel and nonobvious features and aspects of the various disclosed methods, apparatus, and equivalents thereof, alone and in various combinations and subcombinations with one another. The disclosed technology is not limited to any specific aspect or feature, or combination thereof, nor do the disclosed methods and apparatus require that any one or more specific advantages be present or problems be solved.

As used in this application and in the claims, the singular forms "a," "an" and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures do not show the various ways in which the disclosed methods and apparatus can be used in conjunction with other methods and apparatus.

Any of the methods described herein can be performed (at least in part) using software comprising computer-executable instructions stored on one or more computer-readable media. Furthermore, any intermediate or final results of the disclosed methods can be stored on one or more computer-readable media. For example, a software tool can be used to determine and store one or more control signals used to control any of the disclosed apparatus. Any such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For the same reason, computer hardware is not described in further detail. It should be understood that the disclosed technology is not limited to any specific computer language, program, or computer. For instance, a wide variety of commercially available computer languages, programs, and computers can be used.

Figure 1:
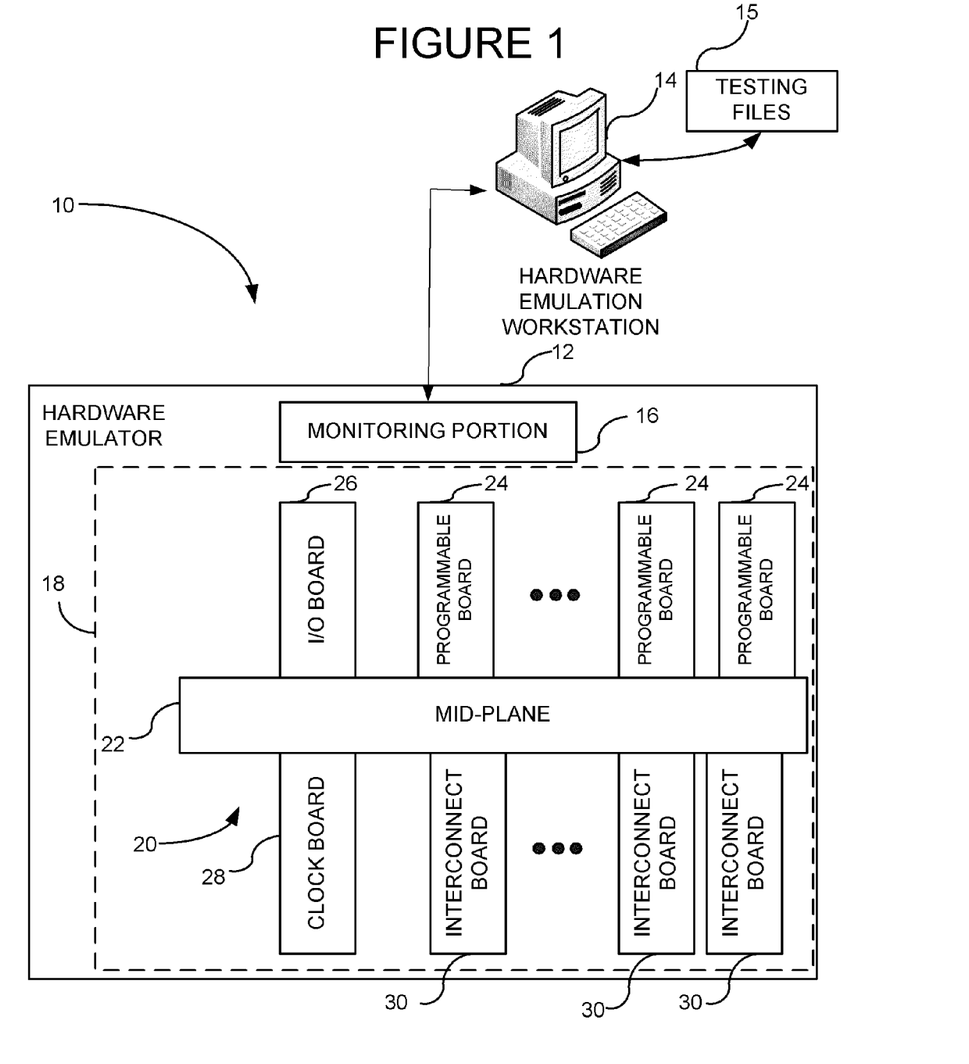
FIG. 1 is a system diagram of an exemplary hardware emulator environment.

FIG. 1 shows an embodiment of an emulator environment 10 including a hardware emulator 12 coupled to one or more hardware emulator hosts 14. The emulator host 14 can be any desired type of computer hardware and generally can include a user interface through which a user can load, compile and download a design to the emulator 12. As described further below, the host 14 includes one or more servers for communicating with and testing the hardware emulator 12. In particular, testing files 15 can be stored on the emulator host 14 and allow testing of the emulator 12.

The emulator 12 can include a monitoring portion 16 and an emulation portion 18. The emulation portion 18 can include multiple printed circuit boards 20 coupled to a midplane 22. The midplane 22 can allow physical connection of the printed circuit boards into the emulator 12 on both sides of the midplane. A backplane can also be used in place of the midplane, the backplane allowing connection of printed circuit boards on one side of the backplane. Any desired type of printed circuit boards can be used. For example, programmable boards 24 generally can include an array of FPGAs, VLSIs or ICs, or other programmable circuitry, that can be programmed with the user's design downloaded from the emulator host 14. One or more I/O board interfaces 26 can allow communication between the emulator 12 and hardware external to the emulator. For example, the user can have a preexisting processor board that is used in conjunction with the emulator and such a processor board connects to the emulator through I/O board interface 26. A clock board 28 can be used to generate any number of desired clock signals. The interconnect boards 30 can allow integrated circuits on the programmable boards 24 to communicate together and with integrated circuits on the I/O board interface 26. Any combination of the above-mentioned boards may be used and any boards may be omitted. Additionally, it may be desirable in some applications to omit the midplane or backplane and use a different connection scheme.

Figure 2:
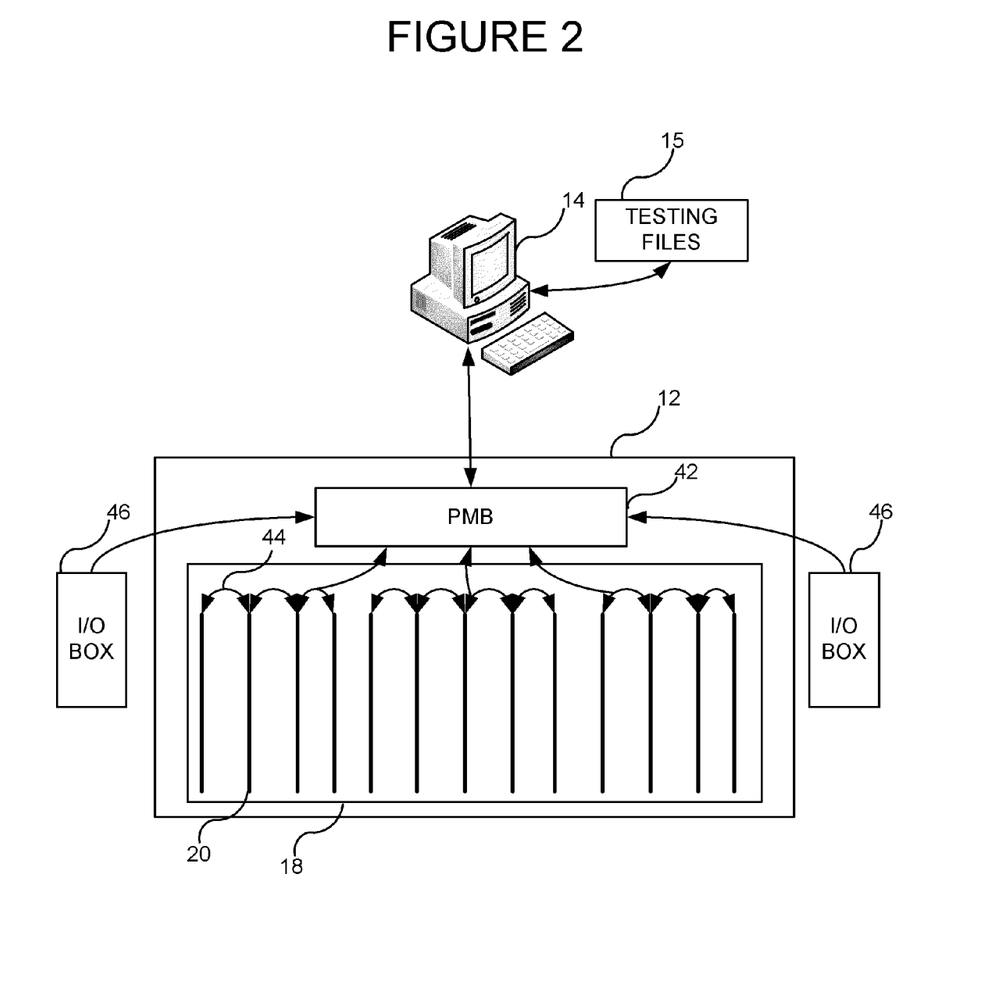
FIG. 2 is a more detailed exemplary system diagram showing a host computer coupled to the emulator through an intermediate platform maintenance board.

FIG. 2 shows a more detailed view of the exemplary system. The host computer 14 can be equipped with a high-speed-link PCI board coupled to a platform maintenance board (PMB) 42, which can act as the monitoring portion 16. The PMB 42 can monitor various physical parameters in the emulator portion 18 and can create the interface between the emulator portion 18 and the one or more host computers 14. The PMB 42 can, for example, on a periodic basis (e.g., 10 seconds), transmit communication and monitoring reports to the host workstation 14 for display in the GUI. Similarly, the PMB 42 can receive information regarding the physical parameters of the emulator portion 18, such as periodically. For example, hardware (e.g., an FPGA) on each printed circuit board 20 can have intelligence for monitoring physical parameters on its respective board and for sending this physical information to the PMB (e.g., every 5 seconds). Other changes, such as a detected error, can be transmitted immediately upon and in response to the detection. Thus, the PMB 42 can in one embodiment instantaneously (as opposed to periodically) detect any changes in the emulation environment 10 and can generate real-time state change messages to the host station 14. All of the physical parameters obtained through the PMB can be obtained while the emulator portion 18 is performing emulation. Thus, several emulations can be separately running and the physical parameters of the emulator can be separately viewed on the GUI of the host computers. However, there need not be a link between the number of simultaneous emulations and the number of workstations. For example, many emulations can be simultaneously run through one workstation. IO boxes 46 allow connection of other user boards to the system. The IO boxes 46 can also be coupled to the PMB 42 and monitored thereby.

Figure 3:
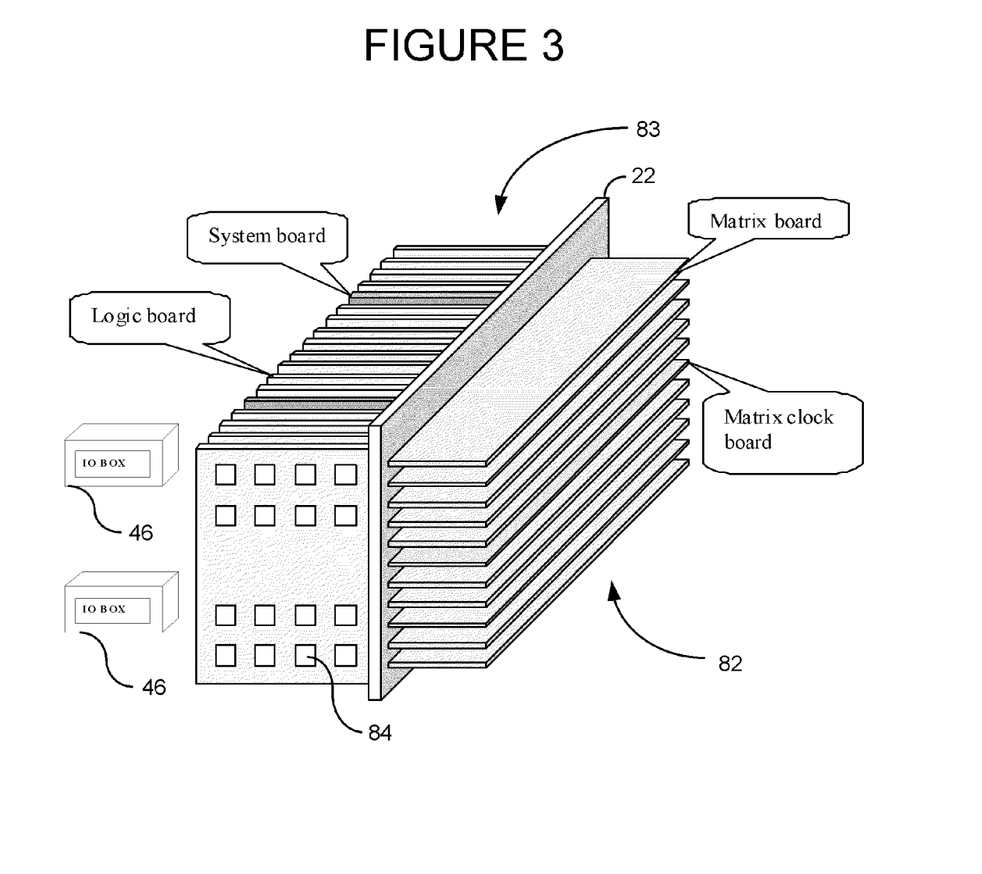
FIG. 3 is a three-dimensional physical view of an exemplary system in accordance with FIG. 1.

FIG. 3 shows an embodiment of a physical three-dimensional view of a single emulator chassis, which corresponds to the emulator portion 18, including the midplane 22 having horizontal boards 82 coupled to one side of the midplane, and vertical boards 83 coupled to the opposite side of the midplane. The physical integrated circuits are shown at 84. The IO boxes 46 can sit separately and are typically not generally considered part of the emulator.

Figure 4:
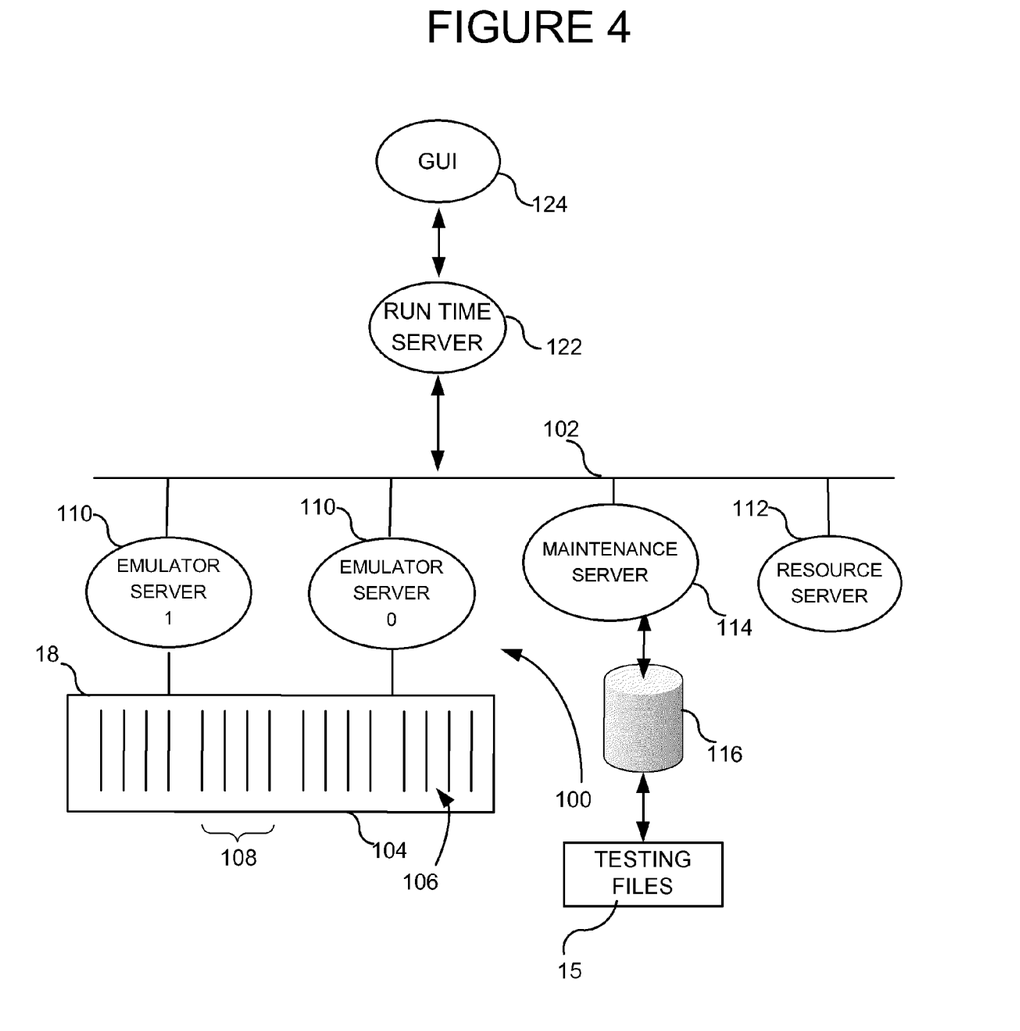
FIG. 4 is a high-level system diagram of an embodiment showing various servers connected through a messaging bus.

FIG. 4 shows a view of an embodiment of the emulator system including various servers (collectively indicated by number 100) that, in this embodiment, can communicate with one another, such as through a messaging bus 102. The emulator servers can be run from the workstation 14 (FIG. 1). The emulator of FIG. 4 is a single chassis emulator, as shown at 104, but the emulator can include a plurality of chassis. Each chassis can include any number of printed circuit boards, shown generally at 106, but in the illustrated embodiment there are sixteen printed circuit boards. The printed circuit boards can be divided into partitions, such as the partition 108. A partition can be a set of one or more printed circuit boards, such as, for example, can be defined by the user, but in this embodiment a partition includes four printed circuit boards. By changing the size of the partitions, the user can change the granularity of the system. Emulator servers 110 can be in charge of managing a physical host connection to the emulator and can provide for the transfer of data between the emulator messaging bus 102 and the emulation portion 18. Thus, communication with the emulator boards 106 can be accomplished through the emulator servers. Any number of emulator servers 110 can be added. In one specific example there is one emulator server for each design being run in the emulator. A resource server 112 can be in charge of managing the different emulator resources provided to the applications. A maintenance server 114 can communicate with a database 116 that stores files associated with testing the emulator boards 106, including the testing files 15. For example, different file structures can be used to allow a user to select tests to be executed on the emulator boards. Such files can be simple text files that can be easily manipulated and updated. A run-time server 122 can receive instructions through a GUI 124 and can interact with the emulator servers 64 either directly or indirectly to receive data from the emulator servers and provide control information to the emulator servers.

Figure 5:
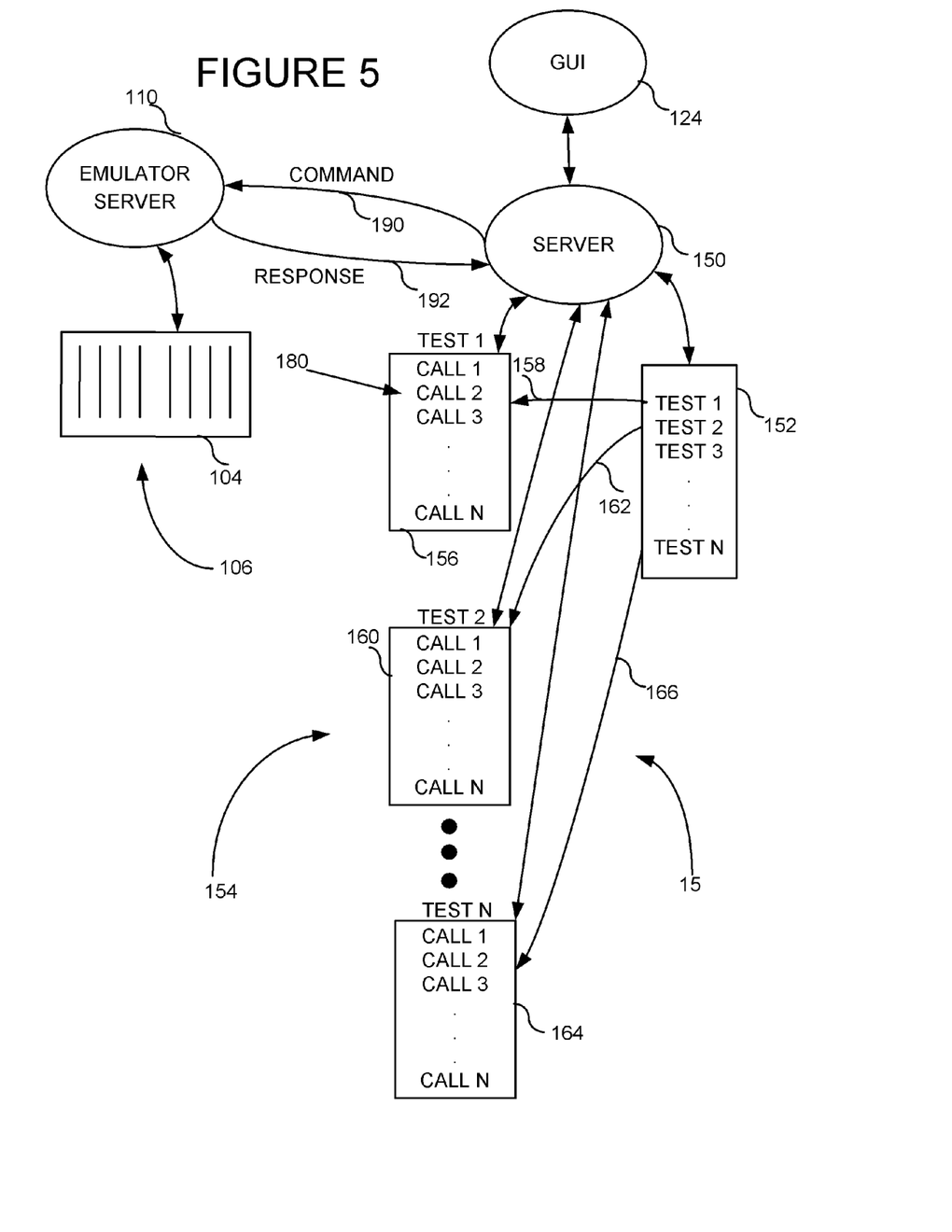
FIG. 5 is a system diagram showing a file structure for executing tests in a hardware emulator.

FIG. 5 shows an embodiment of the emulator system including specific testing files 15 for testing the emulator boards 106. The user interface 124 can be coupled directly or indirectly (e.g., through the run-time server 122 (FIG. 4)) to a server 150. The server 150 can read a list 152 of test names to be executed from a database. The test names can be any desired form, such as a text name, a pointer to an address, a function call, etc. An example server 150 can be the maintenance server 114 and its associated database 116. Although not shown, the server 150 can include a sequencer to sequence through commands or test names. The test names can be any number of tests (1-N) and the list can be in a file format that is easily modifiable (e.g., text file). The test names can be pointers to different command files, shown generally at 154, stored on the database. The command files 154 can also be in any desired format that is easily modifiable, such as a text file. The command files 154 can have a one-to-one correspondence with the list of test names 152. For example, the name "Test 1" from file 152 can point to file 156, as indicated by arrow 158, the name "Test 2" can point to file 160, as indicated by arrow 162, the name "Test N" can point to file 164 as shown by arrow 166, etc. As such, the command files are considered secondary files. Other file structures may be used. For example, the list of test names 152 can be eliminated and the command files 154 can be directly read by the server 150. However, the list of test names 152 is desirable so that a plurality of tests can be automatically executed. The command files 154 can include a list of commands, which in this example are function calls shown at 180. The function calls 180 can include parameters, such as on which of the circuit boards 106 the function call should be executed. The function calls 180 can collectively form a test, such as test 1 at 156. The server 150 can read the list of function calls 180 (e.g., sequentially or in an order determined by the server 150) associated with the test and can send the function calls to the emulator server 110 in the form of commands (see arrow 190). The emulator server 110 can then ensure that each test command is executed on the desired board by transmitting the command to the identified emulator board for execution. Once the command is executed, a response can be sent back to the emulator server 110 and, in turn, to the server 150, as indicated at arrow 192. Once all of the function calls 180 have been sent, that particular test can be considered completed. A result can then be displayed on the GUI 124 or further tests can be executed as identified in the list 152. Although FIG. 5 shows a single emulator server, additional emulator servers can be used. In such a case, the server 150 could communicate with the other emulator servers in addition to emulator server 110. Each emulator server can be associated with a corresponding chassis.

A particular advantage of the structure of FIG. 5 is that the list of tests 152 and the list of commands in the command files 154 can be easily modified without recompiling. In order to modify the list of tests 152 and the command files 154, the user communicates the modifications through the GUI 124 to the server 150, which updates the lists 152, 154 in accordance with the user's instructions.

Figure 6:
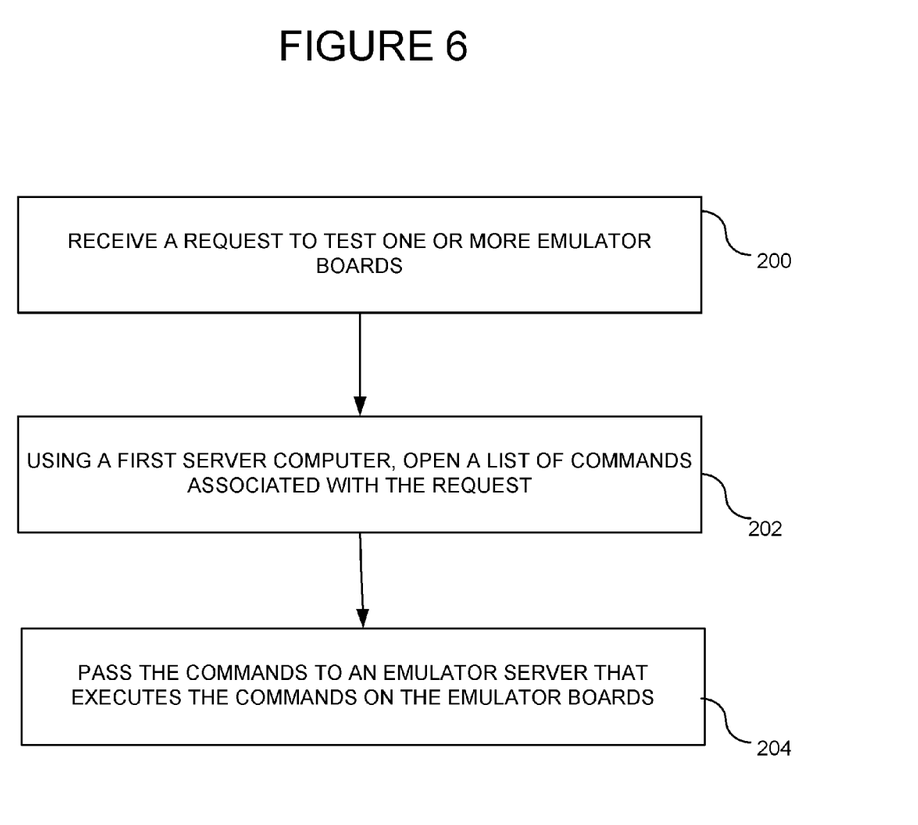
FIG. 6 is a flowchart of an embodiment showing further details of testing in a hardware emulator.

FIG. 6 is a flowchart of an embodiment for testing one or more emulator boards. In process block 200, a request can be received to test one or more emulator boards. Such a request can be received through the GUI 124. Generally, such a request can identify the desired test or series of tests to be executed and the emulator boards on which the tests can be executed. In process block 202, a server can be used to open a list of commands associated with the request. For example, the server 150 can open a list of commands 156. In process block 204, the commands can be passed to the emulator server 110 that can ensure the commands are executed on the proper emulator boards by passing the command to the identified emulator board.

Figure 7:
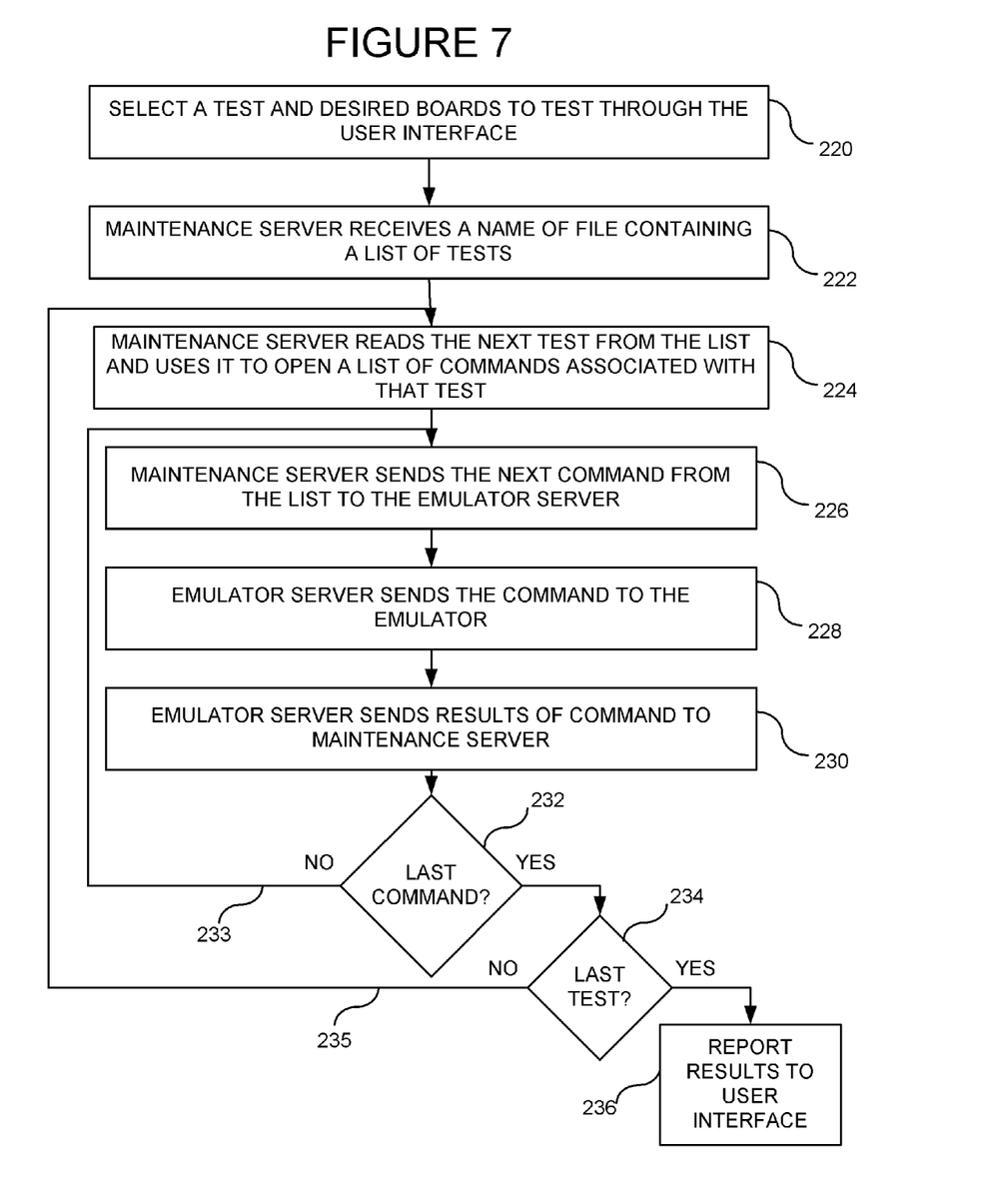
FIG. 7 is a flowchart of an embodiment showing further details of testing in a hardware emulator.

FIG. 7 shows an embodiment of a flowchart illustrating testing one or more emulator boards in a hardware emulator. In process block 220, a test or series of tests as well as the desired board or boards to test can be selected, such as through a user interface. In process block 222, a maintenance server, such as shown at 114 in FIG. 4, can receive a name of the test or file containing a list of tests in response to the user selection. In process block 224, the maintenance server can open the list of tests on the first iteration and can read the first item on the list, which can be a test number pointing to a list of commands. The maintenance server can then open the list of commands associated with the current test number from the list. In process block 226, the maintenance server can send the next command from the list of commands to the emulator server together with the desired board or boards to test. The command can be a function call and certain parameters can be added to the function call by the maintenance server, such as one or more emulator board numbers to be tested. Thus, the maintenance server can create the function call through a combination of the list of commands and the user input regarding emulator board numbers. Alternatively, the emulator board numbers may be built into one of the lists, or otherwise fixed. The maintenance server can wait and pass the next command only after a response is received to latest sent command. In process block 228, the emulator server can send the command to the appropriate emulator board in order to execute the test. The emulator board can then execute the test associated with the command. In one embodiment, the commands can be function calls that are executed by the emulator boards using preexisting compiled code. When each emulator board has finished executing the function call, the emulator server can receive an indication that the task was completed or failed. In process block 230, when all the emulator boards have finished, the emulator server can send the results of the emulator boards back to the maintenance server. Alternatively, interim results can be communicated to the maintenance server for display. In decision block 232, a check can be made by the maintenance server whether the last command has been executed in the current list. If not, then a loop 233 can continue and the next command can be processed. If yes, then in decision block 234, a check can be made whether this is the last test number on the list of tests. If no, then a loop 235 continues and the next test number from the list of tests can be processed as described above. If decision block 234 is answered in the affirmative, then at process block 236, the maintenance server can make a determination of the results and report the results to the user interface for display to the user.

Having described and illustrated the principles of illustrated embodiments, it will be recognized that the embodiments can be modified in arrangement and detail without departing from such principles.

For example, although different files are indicated for listing tests and commands, such files can be combined into a single file. Other file structures can easily be used. For example, the commands can be thought of as sub-tests associated with the tests and a file can be so structured.

In view of the many possible embodiments to which the principles of the disclosed invention may be applied, it should be recognized that the illustrated embodiments are only examples of the invention and should not be taken as limiting the scope of the invention. Rather, the scope of the invention is defined by the following claims. We therefore claim as our invention all that comes within the scope and spirit of these claims.

We claim:

1. A method of testing emulator boards in a hardware emulator, comprising:
    receiving a request to test one or more emulator boards in the hardware emulator;
    in response to the request, reading, in a first server, a first file, which includes a list of test names, wherein a first test name points to a first list of commands associated with the request and a second test name points to a second list of commands, different than the first list of commands;
    passing the first and second lists of commands to a second server coupled to the one or more emulator boards; and
    executing the first and second lists of commands received by the second server on the one or more emulator boards in order to test the emulator boards.

2. The method of claim 1, further including opening a list of tests associated with the request and wherein a first test includes the list of commands and other tests include additional lists of commands.

3. The method of claim 1, further including receiving a response to each of the commands and passing a result to a user interface.

4. The method of claim 1, wherein the commands include function calls with parameters including an emulator board number.

5. The method of claim 1, further comprising modifying the list of commands and executing the modified list without compilation.

6. The method of claim 1, wherein the request includes a name of a file and a list of emulator boards to be tested.

7. A computer-readable storage device storing computer-executable instructions which when executed will cause a computer system to perform a method of testing emulator boards in a hardware emulator, the method comprising:
    receiving a request to test one or more emulator boards in the hardware emulator;
    in response to the request, reading, in a first server, a test file that includes a list of test names, wherein at least a first test name points to a separate file having a list of commands associated with the request;
    passing the commands to a second server coupled to the one or more emulator boards; and
    executing the commands received by the second server on the one or more emulator boards in order to test the emulator boards.

8. A hardware emulator system, comprising:
    plural emulator boards having programmable logic thereon for emulating a user design;
    a first server coupled to the emulator boards, the first server configured to send test commands to be performed on the emulator boards for testing the emulator boards; and
    a second server coupled to the first server, the second server including a command sequencer configured to sequence through a file including a list of testing commands and to send the testing commands to the first server further including a database coupled to the second server, the database including a first file comprising a list of different tests to execute, the database further including a plurality of secondary files associated with the tests so that the tests point to the secondary files, the secondary files including the list of testing commands associated with the tests.

9. The hardware emulator system of claim 8, wherein the first and second servers are located in a hardware emulation workstation coupled to the plural emulator boards.

10. A method in a hardware emulator system, comprising:
    receiving a request to test one or more emulator boards in the hardware emulator system;
    in response to the request, opening, in a first server, a first list of tests associated with the request, the first list of tests being stored in a file that is modifiable by a user without compilation;
    reading a first test name from the list of tests, the first test name being a pointer to a second list of commands;
    opening the second list of commands associated with the first test name; and
    passing the commands from the second list to a second server for executing the commands on the one or more emulator boards in order to test the emulator boards.

11. The method of claim 10, wherein the commands are function calls.

12. The method of claim 10, wherein the commands are passed sequentially and a next command is passed only after a response from the previous command is received.

13. The method of claim 10, wherein the request is received from a user interface and further including displaying results of the request in the user interface.

14. A computer-readable storage device storing computer-executable instructions which when executed will cause a computer system to perform a method in a hardware emulator system, the method comprising:

receiving a request to test one or more emulator boards in the hardware emulator;

in response to the request, opening, in a first server, a first list of tests associated with the request;

reading a first test name from the first list of tests, the first test name being a pointer to a second list of commands;

opening the second list of commands associated with the first test name; and     passing the commands from the second list to a second server for executing the commands on the one or more emulator boards in order to test the emulator boards.

15. A method of testing emulator boards in a hardware emulator, comprising:

receiving a test to be executed and an identification of one or more emulator boards to be tested;

reading a list of function calls associated with the test, the list of function calls being editable as text by a user;

executing each function call on the identified emulator boards and sending the response to each function call to a server; and     determining a result of the test.

16. The method of claim 15, further including displaying the result of the test.

17. The method of claim 15, wherein the function calls are executed sequentially.

18. The method of claim 15, further including reading a list of sub-tests to be executed associated with the test.

19. The method of claim 18, wherein each sub-test has an associated list of function calls.

20. A hardware emulator system to emulate a user's design, comprising:

means for emulating a user design;

means for reading a first text-based test file including a list of tests to perform and for reading a second command file including a list of commands associated with each test in the test file; and     means for sending the commands to the means for emulating to test the means for emulating.

* * * * *